(12) United States Patent
Aratani

(10) Patent No.: US 7,855,546 B2
(45) Date of Patent: Dec. 21, 2010

(54) CURRENT SENSOR HAVING CORE WITH MAGNETIC GAP

(75) Inventor: Masahiro Aratani, Okazaki (JP)

(73) Assignee: DENSO CORPORATION, Kariya (JP)

( * ) Notice: Subject to any disclaimer, the term of this patent is extended or adjusted under 35 U.S.C. 154(b) by 87 days.

(21) Appl. No.: 12/289,110

(22) Filed: Oct. 21, 2008

(65) Prior Publication Data

US 2009/0128129 A1 May 21, 2009

(30) Foreign Application Priority Data

Nov. 21, 2007 (JP) ............................. 2007-301790

(51) Int. Cl.
*G01R 19/00* (2006.01)
(52) U.S. Cl. ................ 324/117 H; 324/117 R
(58) Field of Classification Search ........................ None
See application file for complete search history.

(56) References Cited

U.S. PATENT DOCUMENTS 4,656,418 A * 4/1987 Boston et al. ................ 324/127
5,552,700 A * 9/1996 Tanabe et al. ............ 324/117 H
7,057,287 B2 * 6/2006 Kumar et al. ................ 257/758
7,084,617 B2 8/2006 Ozaki et al.

FOREIGN PATENT DOCUMENTS

JP    U-H04-90974    8/1992
JP    A-2002-340942    11/2002

* cited by examiner

*Primary Examiner*—Vinh P Nguyen
(74) *Attorney, Agent, or Firm*—Posz Law Group, PLC

(57) ABSTRACT

In a current sensor having a magnetic gap, a main body is divided into a first case segment having a terminal and a second case segment. An opening is formed in the main body. A magnetic sensor element is mounted on an element mounting portion arranged on a surface of the first case segment, the surface attaching to the second case segment. The sensor element is electrically coupled with the terminal. A core holding portion is formed in the main body that surrounds the opening and the element mounting portion. A core having the magnetic gap is inserted in the core holding portion. The sensor element is arranged in the magnetic gap of the core on the element mounting portion. The sensor element can thereby be disposed accurately in the magnetic gap of the core, and detection accuracy of the current sensor can be increased.

9 Claims, 4 Drawing Sheets

CURRENT SENSOR HAVING CORE WITH MAGNETIC GAP

CROSS REFERENCE TO RELATED APPLICATION

The present application is based on Japanese Patent Application No. 2007-301790 filed on Nov. 21, 2007, the disclosure of which is incorporated herein by reference.

FIELD OF THE INVENTION

The present invention relates to a current sensor having a magnetic gap.

BACKGROUND OF THE INVENTION

In an exemplary current sensor, a hall IC is electrically coupled with a terminal through a wiring material secured by electric welding. Thereafter, as described in JP-A-2005-308526 corresponding to U.S. Pat. No. 7,084,617, a hall element is inserted so as to be disposed in a narrow magnetic gap of a core, and is molded by resin.

In such a structure, in order to ensure accuracy of the current sensor, the hall IC must be disposed in the narrow magnetic gap of the core with high accuracy. Therefore, a manufacturing method of the current sensor is restricted significantly, and a cost associated with the manufacturing method becomes high. Moreover, since stress is applied to the hall IC due to molding by the resin, properties of the hall element can fluctuate and detection accuracy of the current sensor decreases.

SUMMARY OF THE INVENTION

It is an object of the present disclosure to provide a current sensor having a magnetic gap.

According to an aspect of the present disclosure, a current sensor having a magnetic gap, the current sensor includes a first case segment having a terminal; a second case segment coupled to the first case segment at a first joining surface of the first case segment and a second joining surface of the second case segment to provide a main body; an opening in the main body, the opening extending from the first case segment to the second case segment, a conductive material capable of being inserted in the opening; an element mounting portion arranged on the first joining surface, and an end portion of the terminal being exposed in the element mounting portion; a first magnetic sensing element mounted on the element mounting portion, and electrically coupled with the terminal; a core holding portion in the main body, the core holding portion surrounding the opening in the main body and the element mounting portion; and a core having the magnetic gap, the core being held in the core holding portion. The magnetic sensing element is arranged on the element mounting portion in the magnetic gap of the core.

Thereby, the magnetic sensing element can be disposed easily in the magnetic gap of the core, and detection accuracy of the current sensor can be increased.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS

First Embodiment

Hereinafter, a first embodiment will be described with reference to FIG. 1 to FIG. 3. FIG. 2 is a perspective view of a current sensor. A current sensor 1 detects a current value flowing through a conductive member such as a bus bar for connecting an in-vehicle battery and an electric component for vehicle, for example. The current sensor 1 is configured by integrating a main body 2 with a core 3. An insertion opening 4, in which the conductive member is inserted, is formed at the center of the main body 2.

Figure 1:
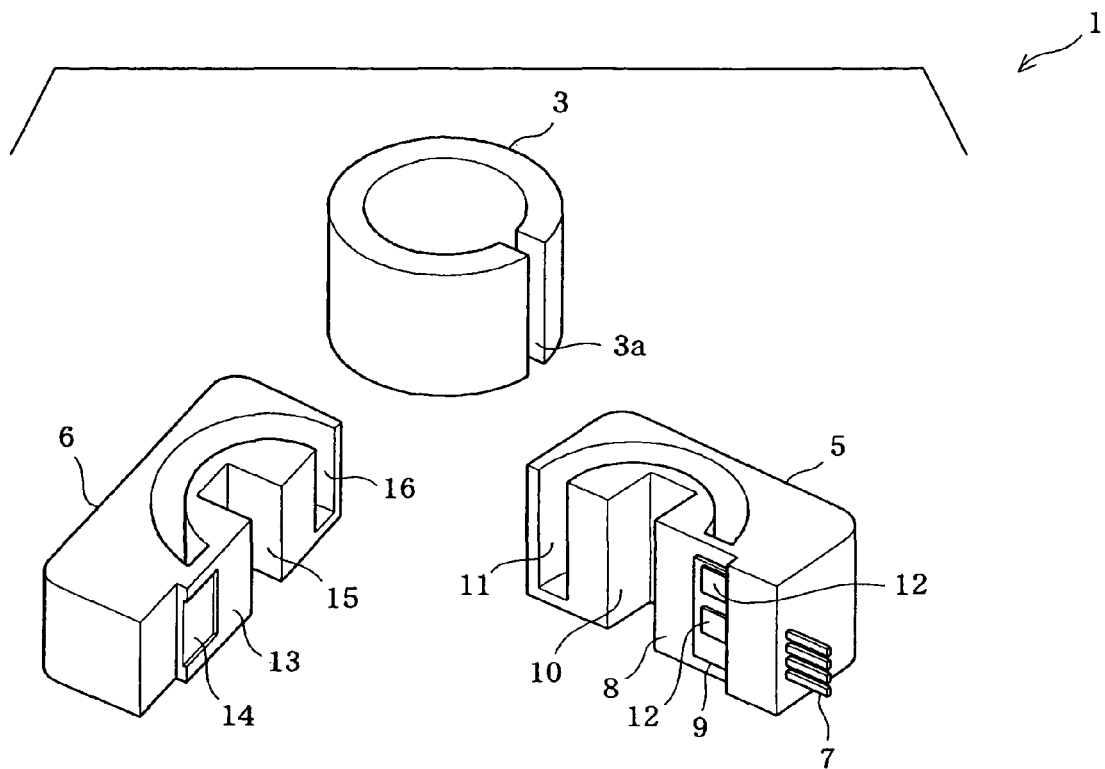
FIG. 1 is a diagram illustrating an exploded perspective view of an exemplary current sensor according to a first embodiment.
Figure 2:
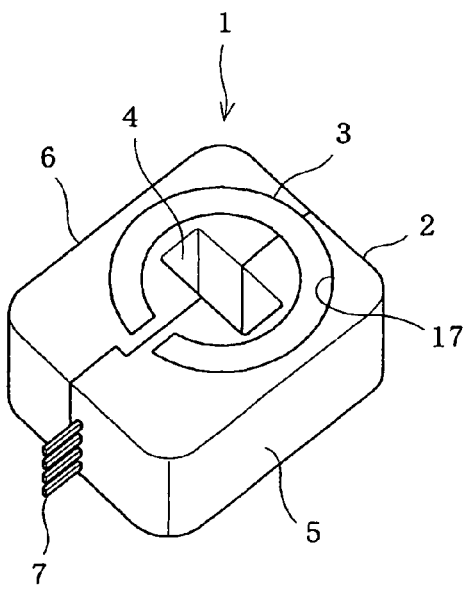
FIG. 2 is a diagram illustrating a perspective view of an exemplary current sensor.

FIG. 1 is an exploded perspective view of the current sensor 1. The main body 2 is configured by combining a first case segment 5 and a second case segment 6, and terminals 7 are inserted in the first case segment 5. An element mounting portion 9 is formed at a joining surface 8, which is a surface of the first case segment 5 that attaches to a corresponding joining surface 13 of the second case segment 6. Terminal portions of the terminals 7 are exposed to the element mounting portion 9. A groove portion 10 is formed across the center of the joining surface 8 of the first case segment 5, and a semicircular groove portion 11 is formed to surround the groove portion 10. One end of the semicircular groove portion 11 is closed by the element mounting portion 9, and another end is opened at the joining surface 8.

Two hall elements 12 (corresponding to a magnetic sensing element), each of which includes a bare chip, are mounted on the element mounting portion 9 of the first case segment 5, and these hall elements 12 are connected to the terminal portions of the terminals 7 by a wire bonding, which is not shown in drawings. The hall elements 12 may be mounted on a die pad portion, which is formed at end portions of the terminals 7.

The two hall elements 12 are provided to be electrically separated, and to output respective detecting signals, such as hall voltages, independently. Two hall elements 12 are mounted for redundancy such that when one hall element 12 fails, the other element can continue to be used. The four terminals 7 are set to be $V_{cc}$, GND, $V_{out1}$ and $V_{out2}$, respectively, and a predetermined pad electrode of the hall elements 12 and the terminal portions of the terminals 7 are connected by the wire bonding. Terminals of $V_{cc}$, GND and $V_{out}$ may be provided with respect to one hall element 12, so that six terminals are provided as a whole. Alternatively, terminals for correction signals may be provided by corresponding to functions of the hall elements 12.

A concave portion 14 corresponding to the element mounting portion 9 is formed at the joining surface 13 of the second case segment 6. A groove portion 15 is formed across the center of the joining surface 13 of the second case segment 6, and a semicircular groove portion 16 is formed to surround the groove portion 15. One end of the semicircular groove portion 16 is closed by the joining surface 13, and another end is opened at the joining surface 13.

Figure 3:
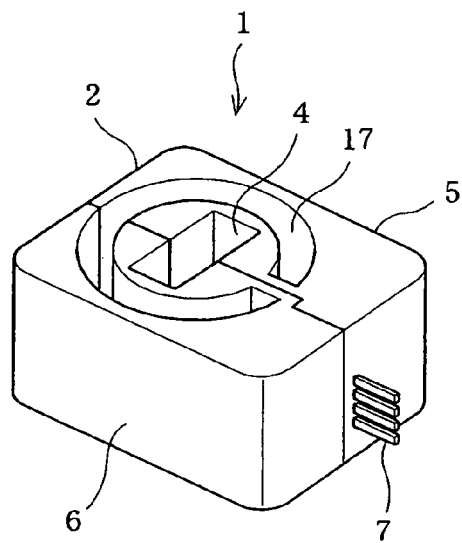
FIG. 3 is a diagram illustrating a perspective view of an exemplary main body.

FIG. 3 is a perspective view of the main body 2. In the main body 2, the insertion opening 4 is configured by the groove portion 10 of the first case segment 5 and the groove portion 15 of the second case segment 6, and a core holding portion 17 is configured by the semicircular groove portion 11 and the semicircular groove portion 16.

As shown in FIG. 2, the core 3 is inserted and fixed in the core holding portion 17. A material of the core 3 is such as a permalloy, which is an iron-nickel alloy, a laminated layer of a magnetic steel plate, a toroidal core and a dust core. The core 3 has a ring shape, and a magnetic gap 3a is formed by cutting a middle portion of the core 3 in a range of 2 to 4 mm. The narrower the magnetic gap 3a of the core 3 becomes, the higher sensitivity of the current sensor becomes. However, the above-mentioned dimension is set because of the location restriction of the hall elements 12 in the magnetic gap 3a. The shape of the core 3 is set in order to correspond to the shape of the conductive material in which the detecting current flows. The shape of the core 3 may be rectangular frame shape or any arbitrary shape.

Next, a manufacturing method of the above-mentioned current sensor 1 will be described. In FIG. 1, the two hall elements 12 are attached to the element mounting portion 9 of the first case segment 5 by a silicone adhesive as a soft adhesive. The hall elements 12 are fixed by the silicone adhesive such that the application of stress from the first case segment 5 to the hall elements 12 is suppressed.

The predetermined pad electrode of the hall elements 12 and the predetermined terminals 7 are connected by the wire bonding. The wire bonding may be a gold wire or an aluminum wire. A silicone gel, such as a gel-like sealing material, is applied to the hall elements 12 mounted on the element mounting portion 9 and cured in order to protect from moisture. Application of the silicone gel may be omitted depending on the use environment.

The first case segment 5 is coupled to the second case segment 6 by a coupling process such as adhesion, snap fit, thermal caulking and laser welding, so that the main body 2 is provided. The core 3 is then inserted into the core holding portion 17 of the main body 2 and bonded by an adhesive. The core 3 may be bonded by thermal caulking in a state that the core 3 is fixed by snap fit.

As mentioned above, the current sensor 1 is provided. When a current flows in the conductive material in a state that the conductive material is inserted in the insertion opening 4 of the current sensor 1, magnetic flux generates in the core 3 by the current, and a voltage by Hall effect, a hall voltage, corresponding to the magnetic flux is generated in the hall elements 12 disposed in a magnetic path, which generates in the magnetic gap 3a by the magnetic flux. The voltage corresponds to amount of the current flowing in the conductive material. Therefore, by outputting the hall voltage generated by the hall elements 12 as a detecting signal to an external device, the external device can detect the amount of the current flowing in the conductive material.

In the conventional art, it is difficult for the hall IC to be disposed in the narrow magnetic gap of the core. On the other hand, according to the present embodiment, the main body 2 of the current sensor 1 is divided into the first case segment 5 and the second case segment 6, and the element mounting portion 9, in which the terminal portions of the terminals 7 are exposed, is formed on the joining surface 8 of the first case segment 5. In addition, in a state that the hall elements 12, which is attached to the element mounting portion 9, is electrically coupled with the terminals 7, the first case segment 5 is bonded or couples to the second case segment 6 to provide the main body 2, and the core 3 having the magnetic gap 3a is fixed in the core holding portion 17 of the main body 2. Therefore, the hall elements 12 can be disposed easily in the magnetic gap 3a of the core 3. Moreover, since the resin molding is not needed for fixing the hall elements 12, stress is not applied to the hall elements 12 and detection accuracy can be increased.

In the conventional art, the hall IC is electrically coupled with the terminal through the wiring material by electric welding. In contrast, according to the present embodiment, the hall elements 12 are electrically coupled with the terminals 7 by the wire bonding. Therefore, reliability of the coupling can be increased. In addition, since the hall elements 12 are attached to the element mounting portion 9 by the silicone adhesive, when stress is applied to the element mounting portion 9, the application of stress to the hall elements 12 can be suppressed. Moreover, since the hall elements 12 are covered by the silicone gel, the current sensor 1 can be protected from the use environment.

Second Embodiment

Figure 4:
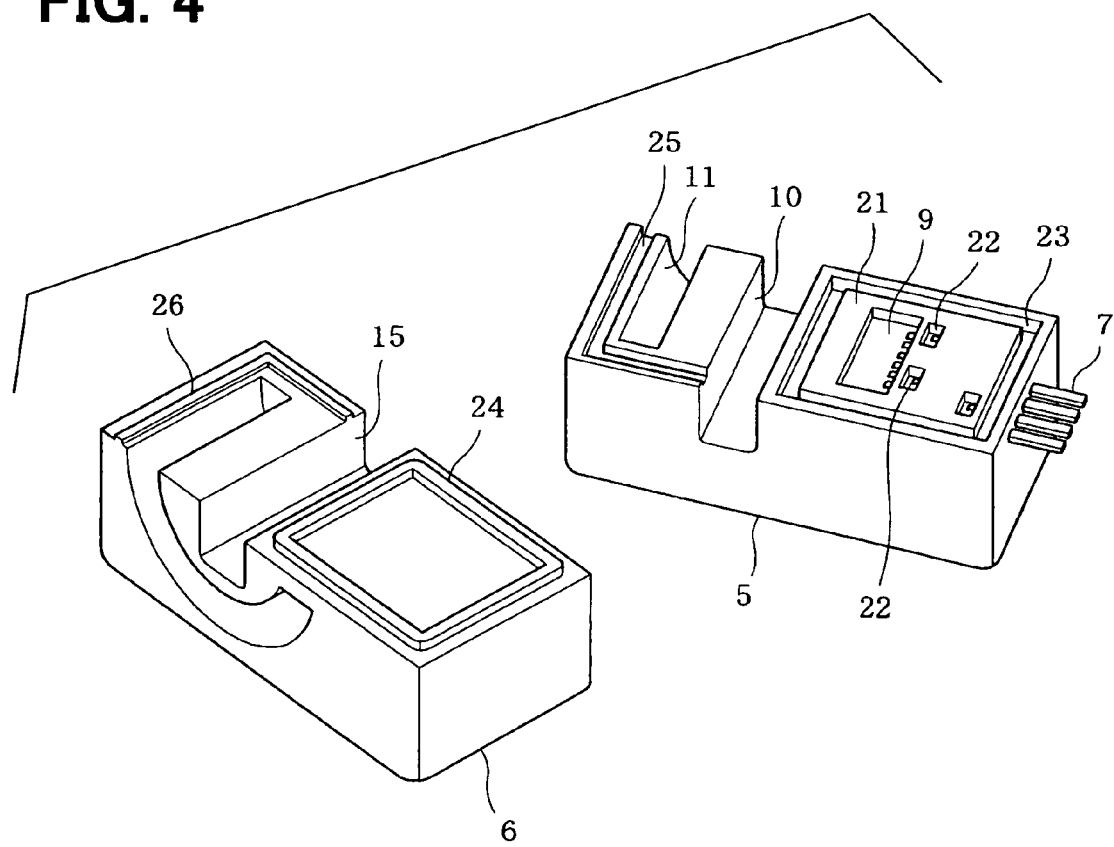
FIG. 4 is a diagram illustrating an exploded perspective view of an exemplary main body according to a second embodiment.

A second embodiment will be described with reference to FIG. 4. In the second embodiment, a chip capacitor is mounted on the joining surface 8 of the first case segment 5.

At the joining surface 8 of the first case segment 5, the element mounting portion 9 is surrounded by a wall portion 21, and the wall portion 21 prevents a silicone gel from flowing from the element mounting portion 9. Multiple chip capacitor mounting indentations 22 are formed adjacent to the element mounting portion 9, and central portions of the terminals 7 are protruded from bottoms of the chip capacitor mounting indentations 22. Multiple chip capacitors (not shown) are mounted in the chip capacitor mounting indentations 22 and attached to the terminals 7 by a conductive adhesive. The chip capacitors are capacitors for protecting against static electricity or noise, and are provided external conventionally.

A rectangular-shaped concave portion 23 is formed on the joining surface 8 of the first case segment 5. A corresponding rectangular-shaped convex portion 24 is formed on the joining surface 13 of the second case segment 6. On the joining surface 8 of the first case segment 5, an L-shaped concave portion 25 is formed at an opposite position with respect to the element mounting portion 9 with the groove portion 10 interposed therebetween. On the joining surface 13 of the second case segment 6, a corresponding L-shaped convex portion 26 is formed at an opposite position with respect to the rectangular-shaped convex portion 24 with the groove portion 15 interposed therebetween. The rectangular-shaped convex portion 24 of the second case segment 6 fits the rectangular-shaped concave portion 23 of the first case segment 5, and the L-shaped convex portion 26 of the second case segment 6 fits the L-shaped concave portion 25 of the first case segment 5, so that both the first and second case segments 5 and 6 are combined with high accuracy.

According to the present embodiment, since the element mounting portion 9 is surrounded by the wall portion 21, the wall portion 21 prevents the silicone gel, which covers the hall elements 12 mounted on the element mounting portion 9, from flowing from the element mounting portion 9. In addition, the concave portions 23 and 25 are formed in the first case segment 5, and the convex portions 24 and 26 are formed in the second case segment 6. Since each of the convex portions 24 and 26 is disposed to fit in each of the concave portions 23 and 25, the first case segment 5 is easily bonded to the second case segment 6 with high accuracy. Moreover, the chip capacitor mounting indentations 22 are formed adjacent to the element mounting portion 9 of the first case segment 5, and the chip capacitors are mounted in the chip capacitor mounting indentations 22. Therefore, the need for external chip capacitors can be reduced.

Third Embodiment

Figure 5:
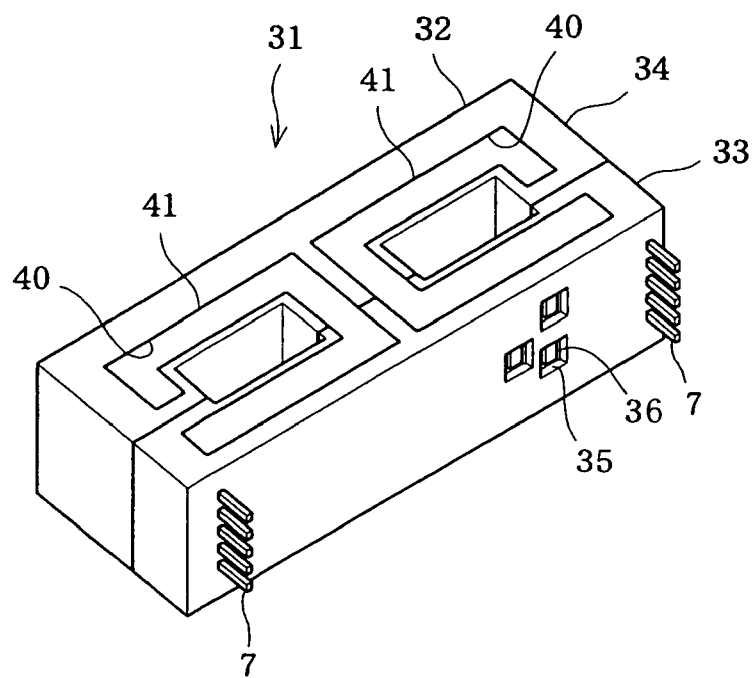
FIG. 5 is a diagram illustrating a perspective view of an exemplary current sensor according to a third embodiment.

A third embodiment will be described with reference to FIG. 5 and FIG. 6. The third embodiment provides a preferred current sensor for measuring two-phase current simultaneously. FIG. 5 is a perspective view of the current sensor. A main body 32 of a current sensor 31 is configured by a first case segment 33 and a second case segment 34. A shape of the first case segment 33 is that the two first case segment 5, which is described in connection with the first embodiment, are connected in parallel. A shape of the second case segment 34 is that the two second case segment 6, which is described in connection with the first embodiment, are connected in parallel. Two pairs of terminals 7 are inserted into the first case segment 33. The terminals 7 can protrude from the center of a bottom surface of the first case segment 33 in parallel. Chip capacitor mounting indentations 35 are formed at the bottom surface of the first case segment 33, and chip capacitors 36 are mounted in each of the chip capacitor mounting indentations 35, so that the chip capacitors 35 are electrically coupled with terminals 7.

Figure 6:
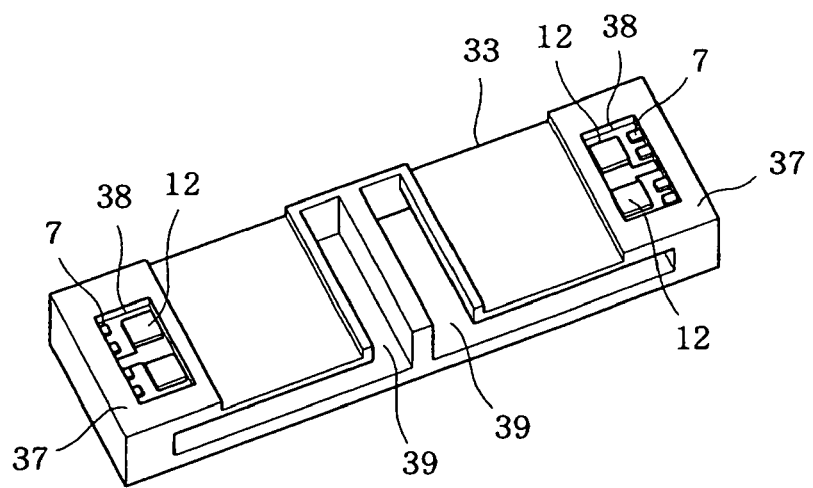
FIG. 6 is a diagram illustrating a perspective view of an exemplary first case segment.

FIG. 6 is a perspective view of the first case segment 33. A pair of element mounting portions 38 is formed on a joining surface 37 of the first case segment 33, and terminal portions of the terminals 7 are protruded to the element mounting portions 38. A pair of hall elements 12 is mounted in one of the element mounting portions 38. The hall elements 12 are electrically coupled with the terminals 7 by wire bonding, which is not shown in drawings.

As shown in FIG. 5, a pair of L-shaped concave portions 39 is formed in the first case segment 33. In a state that the first case segment 33 is bonded to the second case segment 34, a pair of approximately U-shaped core holding portions 40 is formed, and a pair of approximately U-shaped cores 41 is fixed in the corresponding core holding portions 40.

According to the present embodiment, the current sensor 31 can be configured such that a pair of current sensors is connected in parallel. Therefore, the preferred current sensor for measuring two-phase current simultaneously can be obtained.

Fourth Embodiment

A fourth embodiment will be described with reference to FIG. 7. In accordance with the fourth embodiment, a core can be divided.

Figure 7:
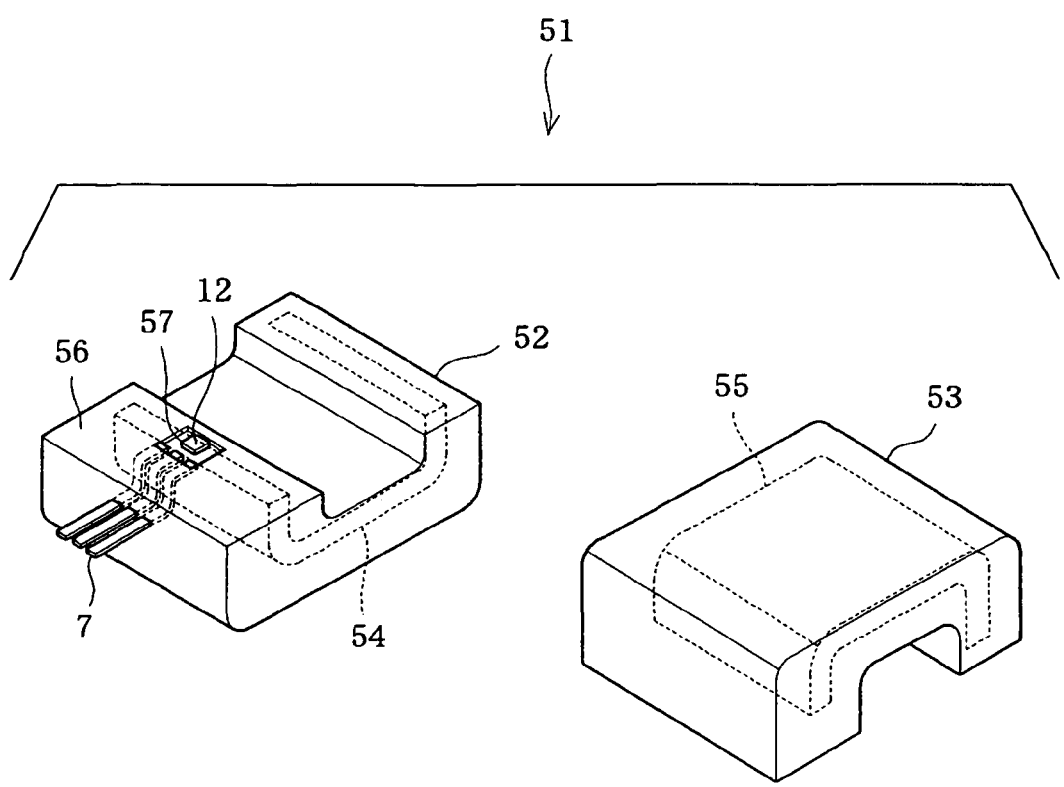
FIG. 7 is a diagram illustrating an exploded perspective view of an exemplary current sensor according to a fourth embodiment.

FIG. 7 is an exploded perspective view of a current sensor. A main body of the current sensor 51 is configured by a first case segment 52 and a second case segment 53. A first core segment 54 is inserted in the first case segment 52, and a second core segment 55 is inserted in the second case segment 53. An element mounting portion 57 is formed on a joining surface 56 of the first case segment 52. A hall element 12 is mounted in the element mounting portion 57 and electrically coupled with terminals 7.

In a state that the first case segment 52 is bonded to the second case segment 53, a core is configured by the first core segment 54 and the second core segment 55, and the hall element 12 is disposed in a magnetic gap of the core.

According to the present embodiment, each of the first core segment 54 and the second core segment 55 is inserted in each of the first case segment 52 and the second case segment 53, so that the hall element 12 can be disposed in the magnetic gap of the core by bonding the first case segment 52 to the second case segment 53. Thereby, a step for bonding the core to the first and the second case segments 52 and 53 can be omitted, and manufacturing steps and manufacturing cost can be decreased.

Moreover, as the magnetic sensing element, a magnetoresistance effect element may be used instead of a hall element. Further, two hall elements may be included in one bare chip. A hall portion and a circuit portion of a sensing portion are configured in the bare chip and an output portion is formed independently, so that a two-part structure is obtained. Moreover, a capacitor, for example, for protecting static electricity or noise which, conventionally, is provided external to a circuit, may be provided inside a circuit so that a printed circuit board or an electrolytic capacitor becomes unnecessary and manufacturing steps and manufacturing cost can be decreased. In addition, three or more hall elements may be provided for redundancy.

While the invention has been described with reference to preferred embodiments thereof, it is to be understood that the invention is not limited to the preferred embodiments and constructions. The invention is intended to cover various modification and equivalent arrangements. In addition, while the various combinations and configurations, which are preferred, other combinations and configurations, including more, less or only a single element, are also within the spirit and scope of the invention.

What is claimed is:

1. A current sensor having a magnetic gap, the current sensor comprising:
   a first case segment having a terminal;
   a second case segment coupled to the first case segment at a first joining surface of the first case segment and a second joining surface of the second case segment to provide a main body;
   an opening in the main body, the opening extending from the first case segment to the second case segment, a conductive material capable of being inserted in the opening;
   an element mounting portion arranged on the first joining surface, and an end portion of the terminal being exposed in the element mounting portion;
   a first magnetic sensing element mounted on the element mounting portion, and electrically coupled with the terminal;
   a core holding portion in the main body, the core holding portion surrounding the opening in the main body and the element mounting portion; and
   a core having the magnetic gap, the core being held in the core holding portion,
   wherein the magnetic sensing element is arranged on the element mounting portion in the magnetic gap of the core,
   wherein the core is integrally formed and has a C-shape, and
   wherein the second joining surface has a concave portion, and the magnetic sensing element is located in a space defined by the element mounting portion and the concave portion when the second case segment is coupled to the first case segment.

2. The current sensor according to claim 1, wherein the magnetic sensing element is mounted on the element mounting portion by a soft adhesive.

3. The current sensor according to claim 1, wherein the magnetic sensing element is electrically coupled with the terminal by a wire bonding.

4. The current sensor according to claim 1, wherein the magnetic sensing element is covered by a gel sealing material.

5. The current sensor according to claim 4, wherein the element mounting portion is surrounded by a wall portion.

6. The current sensor according to claim 1, further comprising:
a second magnetic sensing element,
wherein the second magnetic sensing element is mounted on the element mounting portion, and is electrically coupled with the terminal.

7. The current sensor according to claim 1, wherein the magnetic sensing element is a hall element.

8. The current sensor according to claim 1, wherein the magnetic sensing element is a magnetoresistance effect element.

9. The current sensor according to claim 1, wherein the core is a unitary member.

* * * * *